(12) United States Patent
Beng et al.

(10) Patent No.: US 11,978,838 B2
(45) Date of Patent: May 7, 2024

(54) SURFACE MOUNTABLE LIGHT EMITTING DIODE PACKAGE WITH INCLINED LIGHT EMITTING SURFACE

(71) Applicant: DOMINANT Opto Technologies Sdn Bhd., Melaka (MY)

(72) Inventors: Low Tek Beng, Melaka (MY); Lim Chee Sheng, Melaka (MY)

(73) Assignee: DOMINANT OPTO TECHNOLOGIES SDN BHD., Melaka (MY)

( * ) Notice: Subject to any disclaimer, the term of this patent is extended or adjusted under 35 U.S.C. 154(b) by 212 days.

(21) Appl. No.: 17/119,984

(22) Filed: Dec. 11, 2020

(65) Prior Publication Data
US 2022/0190215 A1  Jun. 16, 2022

(51) Int. Cl.
| | | |
|---|---|---|
| *H01L 33/58* | (2010.01) | |
| *H01L 33/00* | (2010.01) | |
| *H01L 33/10* | (2010.01) | |
| *H01L 33/62* | (2010.01) | |

(52) U.S. Cl.
CPC .......... *H01L 33/58* (2013.01); *H01L 33/0095* (2013.01); *H01L 33/105* (2013.01); *H01L 33/62* (2013.01)

(58) Field of Classification Search
CPC ................ H01L 33/105; H01L 33/486; B60K 2370/1529
See application file for complete search history.

(56) References Cited

U.S. PATENT DOCUMENTS

| | | | | |
|---|---|---|---|---|
| 2010/0007267 A1* | 1/2010 | Imai | ................ | F21K 9/23 313/503 |
| 2010/0061084 A1* | 3/2010 | Lee | ................ | G02F 1/133608 362/97.1 |
| 2013/0020588 A1* | 1/2013 | Yong | ................ | H01L 33/486 257/E33.068 |
| 2016/0293804 A1* | 10/2016 | Haslbeck | ................ | H01L 33/486 |

OTHER PUBLICATIONS

"LED Silicone Materials—Optical Encapsulants for LED" Dupont Electronic Solutions. [https://www.dupont.com/electronic-materials/optical-encapsulants.html] retrieved Nov. 20, 2020, 2 pages.

* cited by examiner

*Primary Examiner* — Jay C Chang
*Assistant Examiner* — Mikka Liu
(74) *Attorney, Agent, or Firm* — Amin, Turocy & Watson, LLP

(57) ABSTRACT

A surface mountable light emitting diode (LED) package with inclined light emitting surface is presented herein. An optoelectronic component comprises the surface mountable package, which comprises a top surface, a cavity, and a mounting surface that is parallel to the top surface to facilitate an attachment, via an automatic surface mount technology pick-and-place equipment, of the mounting surface to a printed circuit board of the optoelectronic component. The cavity comprises a material that facilitates a transmission of electromagnetic radiation comprising visible light and infrared light, optoelectronic device(s) positioned within the cavity that generate and/or receive the electromagnetic radiation, and a light emitting surface that is adjacent to the top surface and that is inclined at an angle relative to a vertical axis of a plane of the top surface to facilitate, via the material, a transmission/reception of the electromagnetic radiation from/by the optoelectronic device(s).

20 Claims, 9 Drawing Sheets

SURFACE MOUNTABLE LIGHT EMITTING DIODE PACKAGE WITH INCLINED LIGHT EMITTING SURFACE

TECHNICAL FIELD

The subject disclosure generally relates to embodiments for a surface mountable light emitting diode (LED) package with inclined light emitting surface.

BACKGROUND

Conventional LED technologies utilize two different types of LED packages: a "top-emitting" LED package and a "side-emitting" LED package. As illustrated by FIG. 8, the top-emitting LED package (810) has an area, surface, etc. of light emission that is parallel to a corresponding mounting surface, e.g., printed circuit board (PCB) (820). Further, as illustrated by FIG. 9, the side-emitting LED package (910) as has an area, surface, etc. of light emission that is perpendicular to a corresponding mounting surface, e.g., PCB (920). In this regard, such LED packages require specialized mounting (not shown) of corresponding PCBs and/or additional, specialized, secondary, etc. optics (not shown) to redirect light from the LED packages towards viewing angles that are not perpendicular and/or parallel to respective mounting surfaces of the LED packages.

In this regard, conventional LED technologies have had some drawbacks, some of which may be noted with reference to the various embodiments described herein below.

BRIEF DESCRIPTION OF THE DRAWINGS

Non-limiting embodiments of the subject disclosure are described with reference to the following figures, wherein like reference numerals refer to like parts throughout the various views unless otherwise specified.

DETAILED DESCRIPTION

Figure 1:
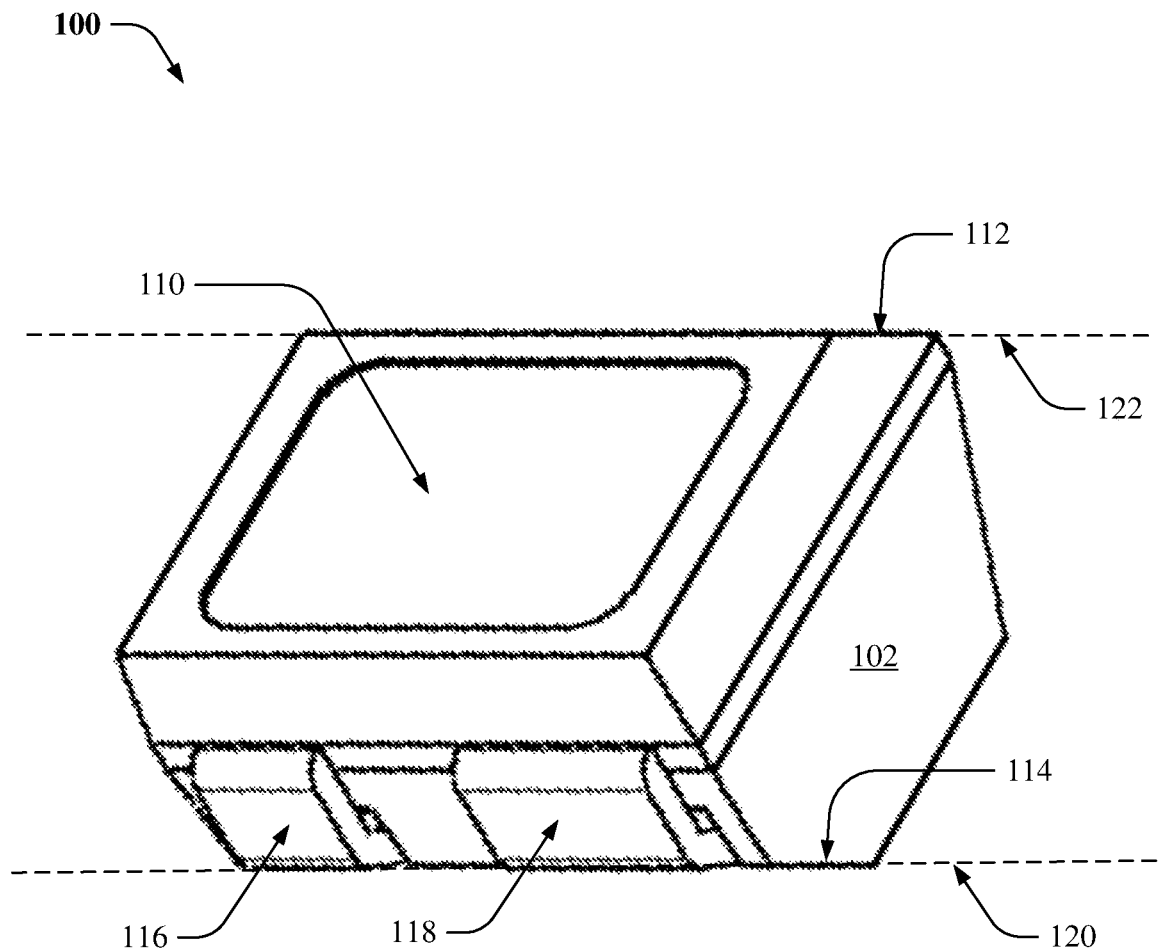
FIG. 1 illustrates a block diagram of a surface mountable LED package with inclined light emitting surface, in accordance with various example embodiments.
Figure 2:
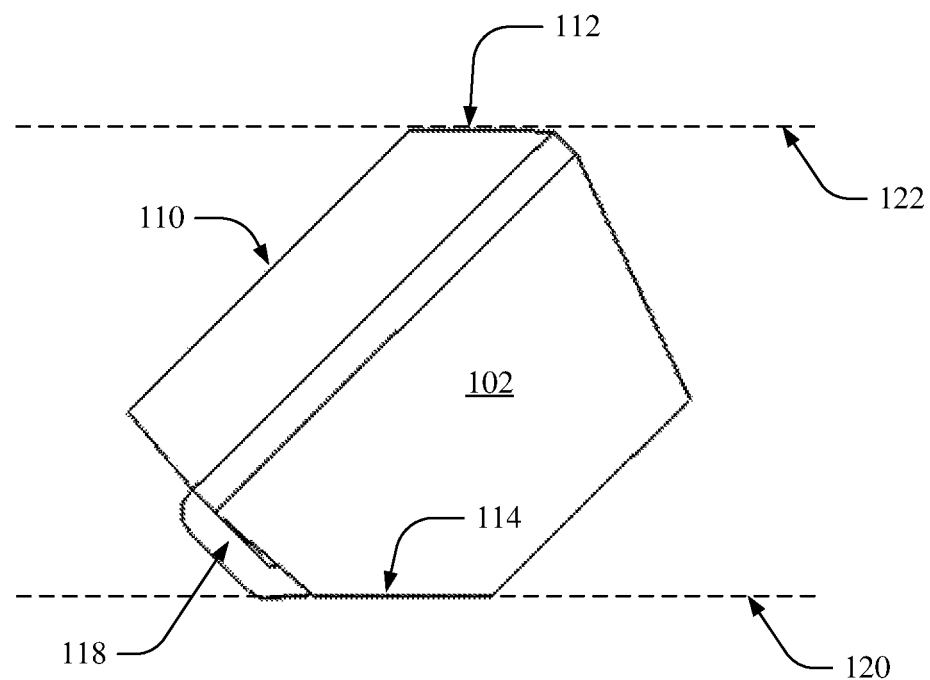
FIG. 2 illustrates a block diagram of a side view of a surface mountable LED package with inclined light emitting surface, in accordance with various example embodiments.
Figure 3:
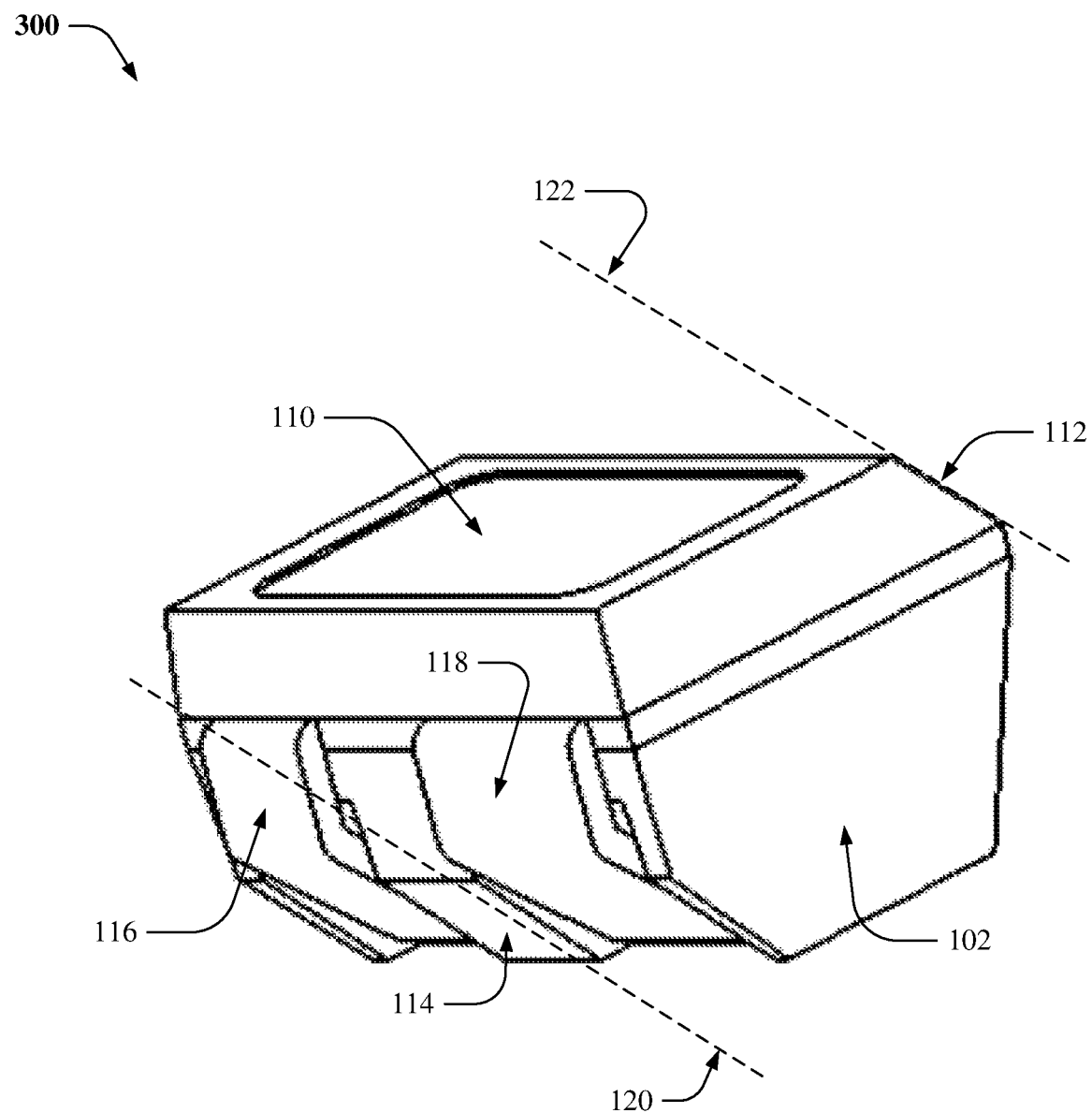
FIG. 3 illustrates a block diagram of a bottom view of a surface mountable LED package with inclined light emitting surface, in accordance with various example embodiments.
Figure 4:
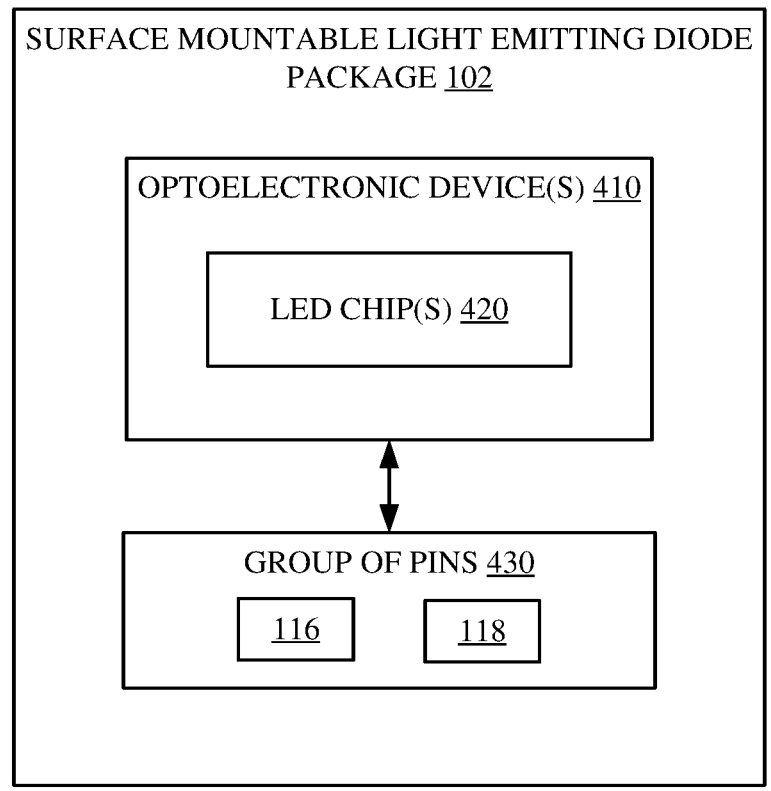
FIG. 4 illustrates a block diagram of a surface mountable LED package with inclined light emitting surface comprising optoelectronic device(s) coupled to a group of pins of the surface mountable LED package, in accordance with various example embodiments.
Figure 5:
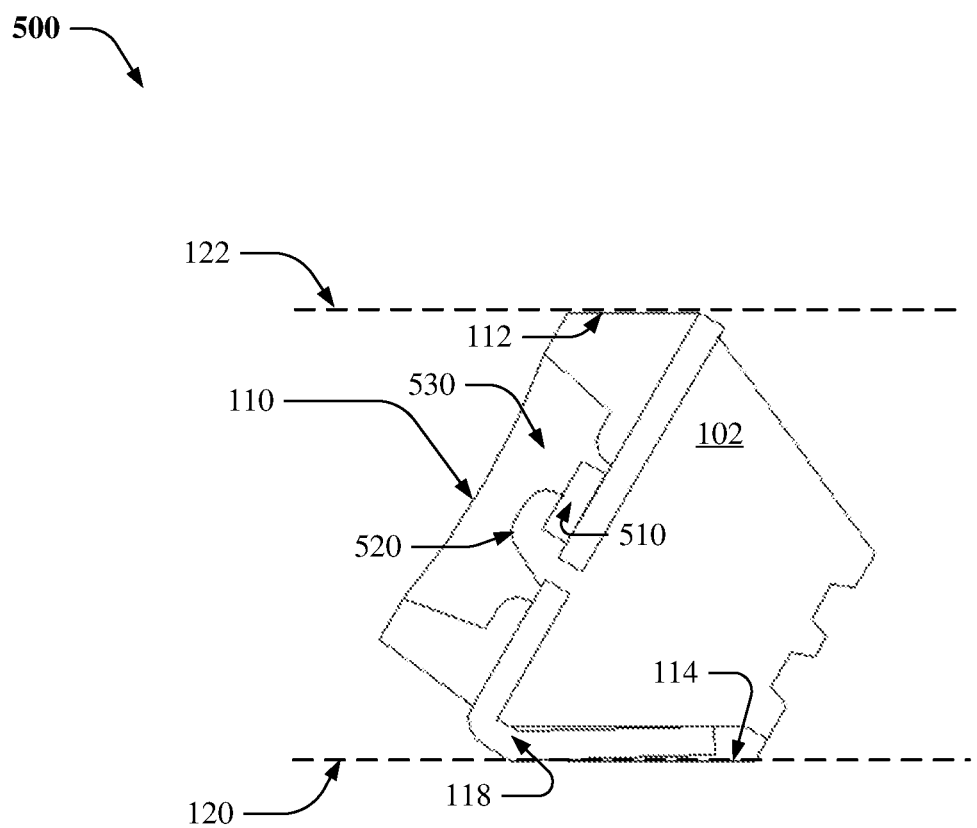
FIG. 5 illustrates a block diagram of a side view of a surface mountable LED package having LED(s) that are encapsulated in an encapsulant and wire bonded to a lead frame of the surface mountable LED package, in accordance with various example embodiments.
Figure 6:
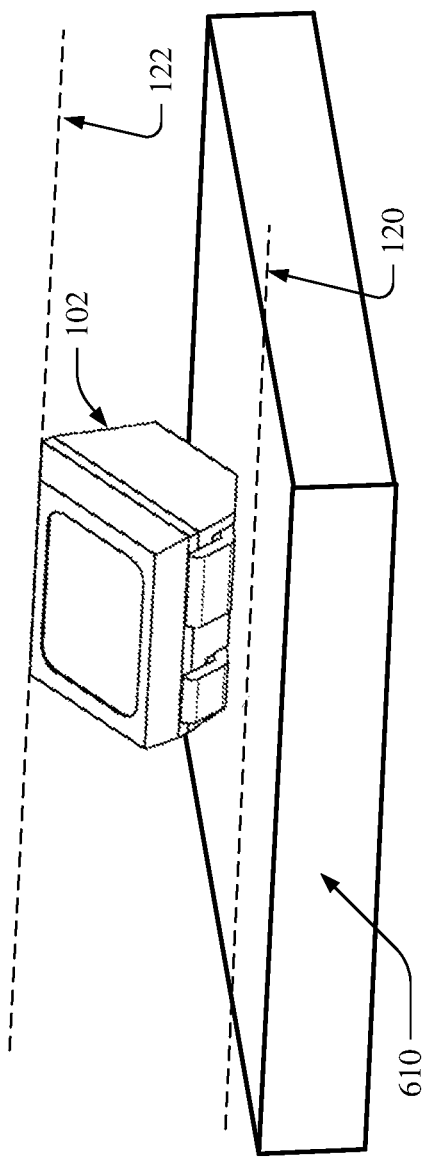
FIG. 6 illustrates a block diagram of a surface mountable LED package with inclined light emitting surface that is attached to a top surface of a printed circuit board (PCB), in accordance with various example embodiments.

Aspects of the subject disclosure will now be described more fully hereinafter with reference to the accompanying drawings in which example embodiments are shown. In the following description, for purposes of explanation, numerous specific details are set forth in order to provide a thorough understanding of the various embodiments. However, the subject disclosure may be embodied in many different forms and should not be construed as limited to the example embodiments set forth herein.

As described above, conventional LED technologies have had some drawbacks with respect to requiring specialized mounting of PCBs and/or secondary optics to redirect light from LEDs, LED packages, and similar devices towards suitable viewing angles. On the other hand, various embodiments disclosed herein can facilitate reduced design costs and improve LED use by utilizing a surface mountable LED package comprising an inclined light emitting surface (LES) having a plane of a defined inclination from a corresponding vertical axis of a mounting surface of the surface mountable LED package.

For example, a light device, an optoelectronic component, a headlight/headlamp, a taillight/taillamp, a head-up display (HUD), a HUD projection device, or other similar device comprises a surface mountable package, the surface mountable package comprising: a top surface and a mounting surface—the top surface being parallel to the mounting surface to facilitate an attachment, via an automatic surface mount (SMT) technology pick-and-place equipment, of the mounting surface to a PCB of the optoelectronic component; a cavity comprising a material that facilitates a transmission of electromagnetic radiation comprising visible light and infrared light; at least one optoelectronic device that is positioned within the cavity and that generates and/or receives the electromagnetic radiation; and a light emitting surface that is adjacent to the top surface and that is inclined at an angle relative to a vertical axis of a plane of the top surface of the surface mountable package to facilitate a transmission, via the material, of the electromagnetic radiation from the at least one optoelectronic device and/or to facilitate a reception, via the material, of the electromagnetic radiation by the at least one optoelectronic device.

In an embodiment, the material comprises an optical encapsulant, an epoxy-based resin, a clear resin, a silicon based encapsulant, or similar material that has been filled in the cavity. In another embodiment, the material further comprises a phosphor, e.g., to convert blue light that has been generated via a blue LED into white light.

In yet another embodiment, the optoelectronic device comprises an LED. In an embodiment, the optoelectronic device comprises a red LED, a green LED, and a blue LED. In another embodiment, the optoelectronic device comprises at least one LED chip.

In an embodiment, the surface mountable package comprises an opaque material. In one embodiment, the surface mountable package has been formed via injection molding (e.g., via plastic), transfer molding, or other molding technique(s) known to those of ordinary skill in the art of manufacturing surface mountable packages having the benefit of the instant disclosure.

In another embodiment, the optoelectronic device comprises a phototransistor, a photodiode, an ambient light sensor, or other similar radiation detection device that detects the electromagnetic radiation.

In yet another embodiment, the optoelectronic component further comprises electrically conductive pins that facilitate an electrical connection between the PCB and the optoelectronic device.

In an embodiment, the angle that is relative to the vertical axis of the plane of the top surface of the surface mountable package is greater than or equal to 20 degrees and less than or equal to 70 degrees.

In one embodiment, a lighting device comprises: a lens that reflects electromagnetic radiation comprising visible and infrared light; and a surface mountable package. In this regard, the surface mountable package comprises: a top surface that is parallel to a mounting surface of the surface mountable package to facilitate an attachment, via an automatic SMT pick-and-place equipment, of the mounting surface to a PCB of the automotive lighting device; a cavity comprising a material that transmits the electromagnetic radiation comprising the visible light and the infrared light; at least one optoelectronic device that is positioned within the cavity and that at least one of generates or receives the electromagnetic radiation; and a light emitting surface that is adjacent to the top surface and that is inclined at an angle relative to a vertical axis of a plane of the top surface to facilitate, via the lens, a transmission, via the material, of the electromagnetic radiation from the at least one optoelectronic device and/or a reception, via the material, of the electromagnetic radiation by the at least one optoelectronic device.

In an embodiment, the lighting device further comprises electrically conductive pins that facilitate an electrical connection between the PCB and the at least one optoelectronic device.

In another embodiment, the lighting device further comprises a tail lamp comprising a group of lenses comprising the lens, in which the group of lenses comprises at least one of a brake lens, a backup lens, or a turn signal lens.

In yet another embodiment, the lighting device further comprises a headlamp comprising a group of lenses comprising the lens, in which the group of lenses comprises at least one of a main beam lens, a high beam lens, a low beam lens, or a fog beam lens.

In an embodiment, the lighting device comprises a head-up display (HUD) comprising the lens, in which the lens projects the electromagnetic radiation onto a windshield of a vehicle comprising the lighting device.

In one embodiment, the material comprises an epoxy-based resin or a silicon-based material that has been filled in the cavity.

In another embodiment, the at least one optoelectronic device comprises at least one of a phototransistor, a photodiode, an ambient light sensor, or other similar detection device that detects the electromagnetic radiation.

Now referring to FIGS. 1-7, various embodiments disclosed herein can improve LED based lighting costs and further improve user experiences with respect to transmission of LED light, e.g., via lighting and display devices, by utilizing a surface mountable LED package having a light emitting surface plane of a defined inclination, e.g., 45 degrees, from a corresponding vertical axis of a top plane or a mounting plane of corresponding surfaces of the surface mountable LED package, e.g., eliminating the need for secondary optics to redirect light from LED(s) that have been mounted on a PCB and/or substrate.

As illustrated by the block diagram (100) of FIG. 1, a surface mountable package (102) of an optoelectronic component (e.g., 710, 720, 730) comprises a top surface (112), e.g., geometrical shape, 2-dimensional shape, or other like shape having a top plane (122) that is parallel to a mounting plane (120) of a mounting surface (114) of the surface mountable package to facilitate an attachment, via an automatic SMT pick-and-place equipment (not shown), of the mounting surface to a PCB (e.g., 610) of the optoelectronic component.

In embodiment(s), the surface mountable package is formed, e.g., via injection molding equipment (not shown), via transfer molding equipment (not shown), or via other molding techniques known to those of ordinary skill in the art of manufacturing surface mountable packages having the benefit of the instant disclosure, e.g., using plastic, an opaque material, or other like material. Further, the surface mountable package comprises a cavity (not shown) that has been filled, injected, or modified by a similar process with a material, encapsulation material, or similar material to facilitate a transmission of electromagnetic radiation comprising visible light and infrared light.

In embodiment(s), the material comprises an optical encapsulant, an epoxy-based resin, a clear resin, a silicon based encapsulant, or similar material. In other embodiment(s), the material further comprises a phosphor, e.g., to convert blue light that has been generated via a blue LED into white light.

In this regard, optoelectronic device(s) (410) of the surface mountable package are positioned within the cavity, e.g., before they are encapsulated with the material, to generate and/or receive, via the material, the electromagnetic radiation. In embodiment(s), the optoelectronic device(s) are mounted in a portion of the cavity corresponding to the mounting surface. In other embodiment(s), the optoelectronic device(s) are mounted above the portion of the cavity corresponding to the mounting surface.

The surface mountable package further comprises a light emitting surface (110) that is adjacent to the top surface and that is inclined at an angle relative to a vertical axis of a plane (122) of the top surface (112) to facilitate a transmission, via the material, of the electromagnetic radiation from the optoelectronic device(s), and/or to facilitate a reception, via the material, of the electromagnetic radiation by the optoelectronic device(s).

In embodiment(s), the angle relative to the vertical axis of the plane of the top surface of the surface mountable package is greater than or equal to 20 degrees and less than or equal to 70 degrees. In other embodiment(s), the angle is approximately, e.g., within 10% of, 45 degrees.

Further, the surface mountable package comprises a group of pins (430) comprising electrically conductive pins (116, 118) (e.g., lead frames) that facilitate an electrical connection between the PCB and the optoelectronic device(s), e.g., between the PCB and respective anodes (not shown) and respective cathodes (not shown) of the optoelectronic device(s). In this regard, the optoelectronic device(s) comprise LED(s) (e.g., 510, LED chip(s) (e.g., 420), or other LED device(s)) that are wire bonded with respective wire(s) (e.g., 520) to the lead frames. Further, an encapsulant/optical encapsulant (530) is added, injected, and/or filled in a cavity of the surface mountable package to surround the LED(s) and the respective wire(s). In embodiment(s), the optical encapsulant comprises an epoxy-based resin, a clear resin, a silicon based encapsulant, or similar material.

In embodiment(s), the optoelectronic device(s) comprise a red LED, a green LED, and a blue LED. In other embodiment(s), the optoelectronic device(s) comprise a phototransitor, a photodiode, an ambient light sensor, or other similar detection device that detects the electromagnetic radiation, e.g., for sensing light, an amount of the light, or other sensing applications regarding the sensing of visible and/or infrared electromagnetic radiation.

Figure 7:
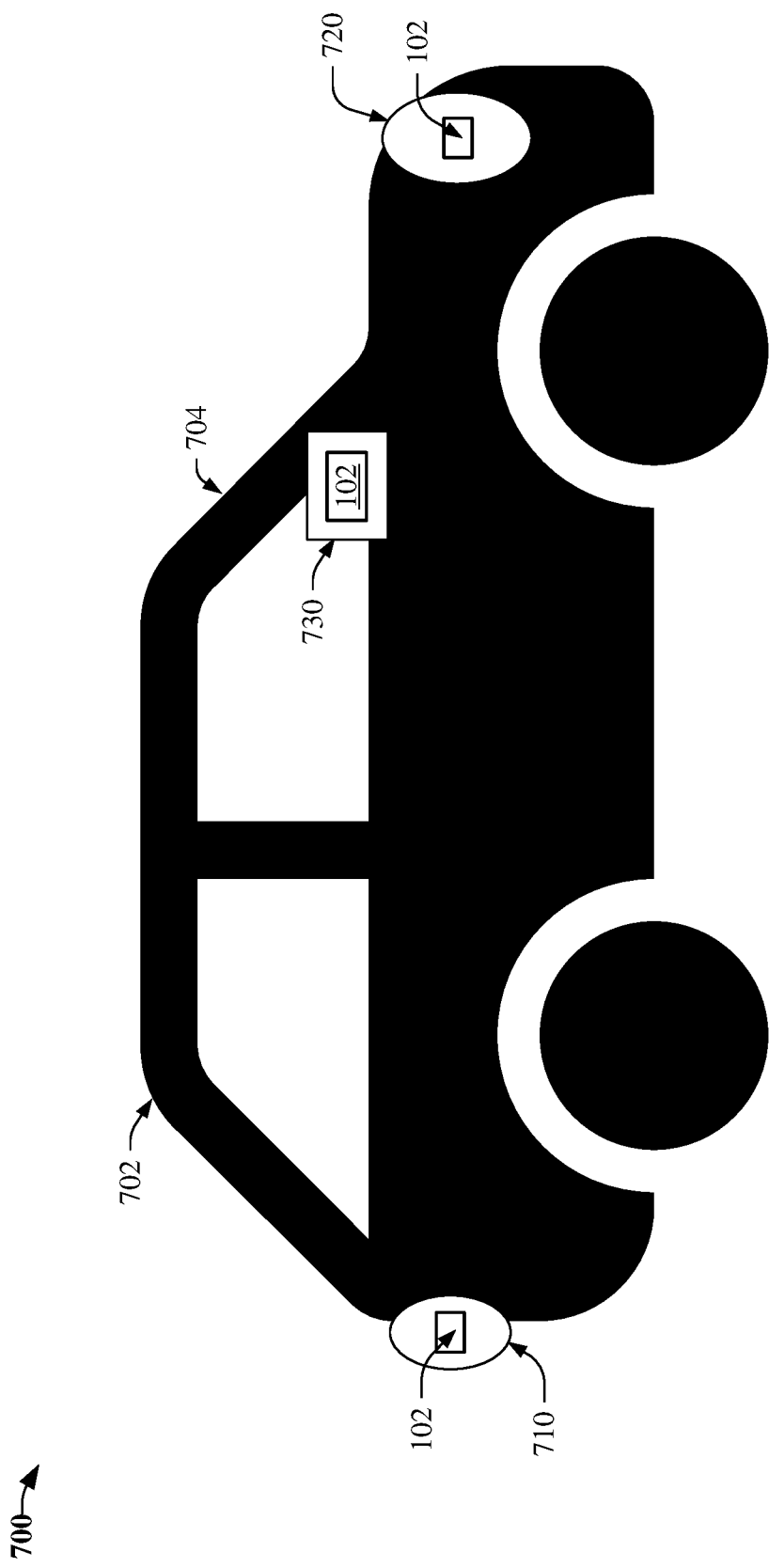
FIG. 7 illustrates a block diagram of a vehicle comprising automotive lighting devices that comprise respective surface mountable LED packages with respective inclined light emitting surfaces, in accordance with various example embodiments.
Figure 8:
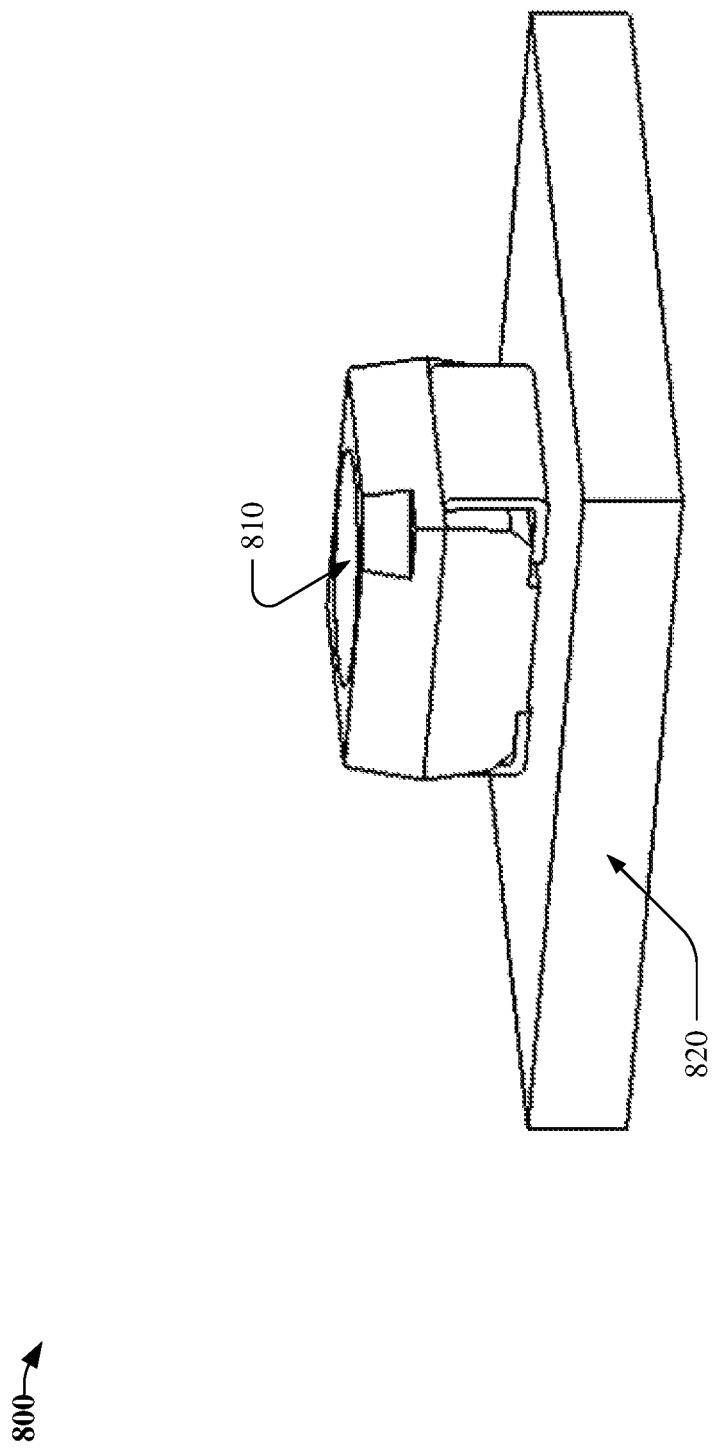
FIG. 8 illustrates a block diagram of a conventional top-emitting LED package, in accordance with various example embodiments.
Figure 9:
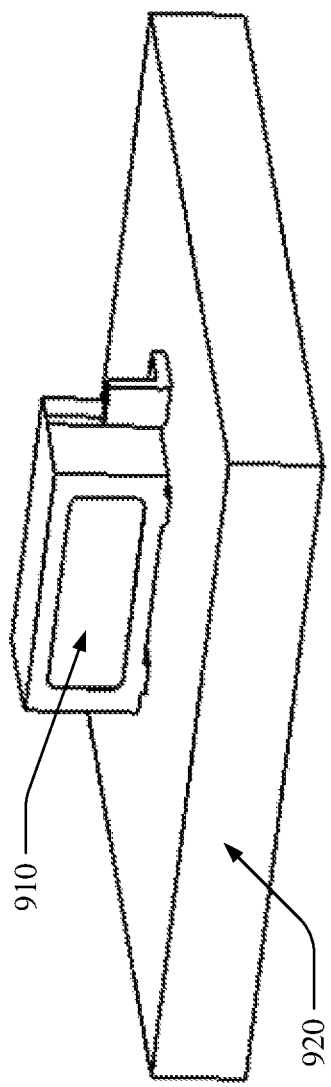
FIG. 9 illustrates a block diagram of a conventional side-emitting LED package, in accordance with various example embodiments.

Now referring to FIG. 7, a block diagram of a vehicle, e.g., automobile (702), including automotive lighting devices (710, 720, 730) that comprise respective surface mountable LED packages with respective inclined light emitting surfaces is illustrated, in accordance with various example embodiments. In this regard, automotive lighting device 710 comprises a taillight, taillamp, or other similar lighting device that comprises a lens/group of lenses (not shown), e.g., a brake light lens, a backup light lens, and/or a turn signal lens. Automotive lighting device 720 comprises a headlight, headlamp, or other similar lighting device that comprises a lens/group of lenses (not shown), e.g., a main beam lens, a high beam lens, a low beam lens, and/or a fog beam lens. Further, automotive lighting device 730 comprises a head-up display (HUD) comprising a projection component (not shown) that projects light onto a windshield (704) of the vehicle.

In this regard, an automotive lighting device comprises one or more lenses (not shown) that reflect electromagnetic radiation comprising visible and infrared light; and a circuit (not shown) comprising a surface mountable package (102) that facilitates, via the one or more lenses, a transmission and/or a reception, via the one or more lenses, of electromagnetic radiation.

In embodiment(s), optoelectronic device(s) of the surface mountable LED package comprise phototransistor(s), photodiode(s), ambient light sensor(s), or other similar detection device(s) that are used to detect, via one or more lenses (not shown) of a headlight/headlamp (720), an amount of daylight outside of the vehicle. Further, in response to the amount of daylight being determined, e.g., using the phototransistor(s), etc. via a circuit (not shown) comprising a processing device and a memory device (both not shown) of the vehicle, to be below a defined amount of daylight representing that a use of the headlight/headlamp would improve road visibility, the processing device can turn on, activate, etc. LED(s) or LED chip(s) of other surface mountable LED package(s) of the headlight/headlamp, e.g., to transmit light via the one more lenses of the headlight/headlamp.

In other embodiment(s), optoelectronic device(s) of the surface mountable LED package comprise an infrared (IR) detector, e.g., IR photodiode, phototransistor, ambient light sensor, or similar device that can be used to detect, utilizing a processing device and a memory device (both not shown) via one or more lenses (not shown) of a taillight/taillamp (710), an external object behind the vehicle, e.g., to assist a driver of the vehicle when the vehicle is in reverse.

In yet other embodiment(s), the HUD (730) of the vehicle comprises surface mountable LED package(s) that project, using a projection component (not shown) comprising a processing device and a memory device via one or more lenses (not shown) of the HUD, light, images, or other similar displays onto a windshield (704) of the vehicle.

As it employed in the subject specification, the terms "component" and "circuit" with respect to operation of an optoelectronic component, a lighting device, and/or an automotive lighting device disclosed herein refer to substantially any analog and/or digital based device(s), circuit(s), or other similar devices comprising a resistor, a capacitor, a transistor, a diode, an inductor, a memory, a programmable device, e.g., fuse, field programmable gate array (FPGA), complex programmable logic device (CPLD), or other similar programmable devices; and/or devices and circuits relevant to performing operations and/or functions disclosed herein.

Further, the terms "processing device" and "processing component" with respect to operation of an optoelectronic component, a lighting device, and/or an automotive lighting device disclosed herein refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an ASIC, a digital signal processor (DSP), an FPGA, a programmable logic controller (PLC), a CPLD, a discrete gate or transistor logic, discrete hardware components, an analog circuit, or any combination thereof designed to perform the functions and/or processes described herein. Further, a processor can exploit nano-scale architectures such as, but not limited to, molecular and quantum-dot based transistors, switches and gates, e.g., in order to optimize space usage or enhance performance of mobile devices. A processor can also be implemented as a combination of computing processing units, devices, etc.

Furthermore, the term "memory", and substantially any other information storage component relevant to operation and functionality of a circuit and/or devices with respect to operation of an optoelectronic component, a lighting device, and/or an automotive lighting device disclosed herein refer to "memory components," or entities embodied in a "memory," or components comprising the memory. It will be appreciated that the memory can include volatile memory and/or nonvolatile memory. By way of illustration, and not limitation, volatile memory, can include random access memory (RAM), which can act as external cache memory. By way of illustration and not limitation, RAM can include synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and/or Rambus dynamic RAM (RDRAM). In other embodiment(s) nonvolatile memory can include read only memory (ROM), programmable ROM (PROM), electrically programmable ROM (EPROM), electrically erasable ROM (EEPROM), or flash memory. Additionally, the components and/or devices disclosed herein can comprise, without being limited to comprising, these and any other suitable types of memory.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

Furthermore, to the extent that the terms "includes," "has," "contains," and other similar words are used in either the detailed description or the appended claims, such terms are intended to be inclusive—in a manner similar to the term "comprising" as an open transition word—without precluding any additional or other elements. Moreover, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Furthermore, the word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art having the benefit of the instant disclosure.

The above description of illustrated embodiments of the subject disclosure is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. An optoelectronic component comprising a surface mountable package, the surface mountable package comprising:
    at least one optoelectronic device that is positioned within a cavity of the surface mountable package;
    a material that has been at least one of added, injected, or filled in the cavity, wherein a light emitting surface of the material facilitates a transmission of electromagnetic radiation comprising visible light and infrared light, and wherein the light emitting surface is adjacent to a top surface of the surface mountable package and is inclined at an angle relative to the top surface to facilitate at least one of
        the transmission, via the material, of the electromagnetic radiation from the at least one optoelectronic device, or
        a reception, via the material, of the electromagnetic radiation by the at least one optoelectronic device; and
    electrically conductive lead frames comprising respective adjacent surfaces that are inclined at respective angles relative to the light emitting surface, wherein the top surface is parallel to a mounting surface of the surface mountable package.

2. The optoelectronic component of claim 1, wherein the material comprises an optical encapsulant that has been filled in the cavity.

3. The optoelectronic component of claim 2, wherein the material further comprises a phosphor.

4. The optoelectronic component of claim 1, wherein the at least one optoelectronic device comprises a light emitting diode (LED).

5. The optoelectronic component of claim 4, wherein the at least one optoelectronic device comprises a red LED, a green LED, and a blue LED.

6. The optoelectronic component of claim 4, wherein the at least one optoelectronic device comprises at least one LED chip.

7. The optoelectronic component of claim 1, wherein the surface mountable package comprises an opaque material.

8. The optoelectronic component of claim 7, wherein the surface mountable package has been formed via injection molding or transfer molding.

9. The optoelectronic component of claim 1, wherein the at least one optoelectronic device comprises at least one of a phototransistor, a photodiode, or an ambient light sensor that detects the electromagnetic radiation.

10. The optoelectronic component of claim 1,
    wherein the mounting surface is attached, via the electrically conductive lead frames, to a printed circuit board of the optoelectronic component.

11. The optoelectronic component of claim 1, wherein the angle is greater than or equal to 20 degrees and less than or equal to 70 degrees.

12. A lighting device, comprising:
    a lens that reflects electromagnetic radiation comprising visible and infrared light; and
    a surface mountable package comprising
        a top surface that is parallel to a mounting surface of the surface mountable package to facilitate an attachment, via an automatic surface mount technology pick-and-place equipment, of the mounting surface to a printed circuit board (PCB) of the lighting device,
        a cavity comprising a material that transmits the electromagnetic radiation comprising the visible light and the infrared light,
        at least one optoelectronic device that is positioned within the cavity and that generates or receives the electromagnetic radiation, and
        a light emitting surface that is adjacent to the top surface and that is inclined at an angle relative to a vertical axis of a plane of the top surface to facilitate, via the lens, at least one of
            a transmission, via the material, of the electromagnetic radiation from the at least one optoelectronic device, or
            a reception, by the at least one optoelectronic device via the material, of the electromagnetic radiation.

13. The lighting device of claim 12, further comprising:
    electrically conductive pins that facilitate an electrical connection between the PCB and the at least one optoelectronic device.

14. The lighting device of claim 12, further comprising:
    a tail lamp comprising a group of lenses comprising the lens, wherein the group of lenses comprises at least one of a brake lens, a backup lens, or a turn signal lens.

15. The lighting device of claim 12, further comprising:
a headlamp comprising a group of lenses comprising the lens, wherein the group of lenses comprises at least one of a main beam lens, a high beam lens, a low beam lens, or a fog beam lens.

16. The lighting device of claim 12, further comprising:
a head-up display comprising the lens, wherein the lens projects the electromagnetic radiation onto a windshield of a vehicle comprising the lighting device.

17. The lighting device of claim 12, wherein the material comprises an epoxy-based resin or a silicon-based material that has been filled in the cavity.

18. The lighting device of claim 12, wherein the at least one optoelectronic device comprises at least one of a phototransistor, a photodiode, an ambient light sensor that detects the electromagnetic radiation, or a light emitting diode (LED) chip.

19. The lighting device of claim 12, wherein the surface mountable package comprises an opaque material.

20. The lighting device of claim 12, wherein the surface mountable package has been formed via injection molding or transfer molding.

\* \* \* \* \*